Figure 1:
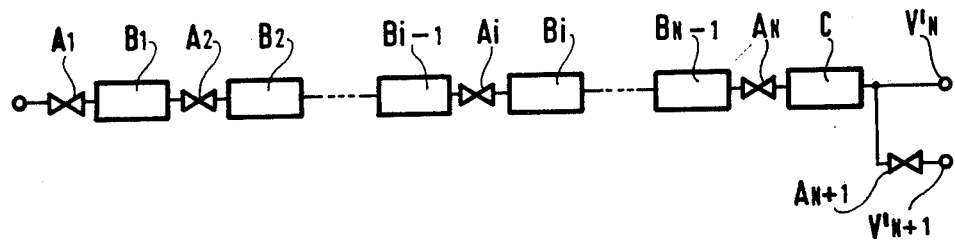

United States Patent [19]

Valle

[11] 4,131,859
[45] Dec. 26, 1978

[54] METHOD OF COMPENSATION OF INTERMODULATION NOISE AND DEVICES FOR THE IMPLEMENTING THEREOF

[75] Inventor: Pierre D. Valle, Colombes, France

[73] Assignee: Compagnie Industrielle des Telecommunications Cit-Alcatel, Paris, France

[21] Appl. No.: 839,170

[22] Filed: Oct. 4, 1977

[30] Foreign Application Priority Data

Oct. 13, 1976 [FR] France .................. 76 30741

[51] Int. Cl.² ............ H03F 1/26; H03F 3/68
[52] U.S. Cl. ................. 330/124 R; 330/149; 330/151
[58] Field of Search ............ 330/124 R, 149, 151; 328/163

[56] References Cited

U.S. PATENT DOCUMENTS

| 3,202,928 | 8/1965 | Prior | 330/124 |
|---|---|---|---|
| 3,383,618 | 5/1968 | Engelbrecht | 330/149 |
| 3,732,502 | 5/1973 | Seidel | 330/149 |
| 3,825,843 | 7/1974 | Felsberg et al. | 330/149 X |

OTHER PUBLICATIONS

Kogan et al., "Transit Apparatus for Tertiary Groups with Amplitude Correction (STTG) and with Amplitude and Phase Correction (STTG-FK)," *Communications and Radio Engineering*, vol. 28/29, No. 9, Sep. 1974, pp. 11-13.

Primary Examiner—James B. Mullins
Attorney, Agent, or Firm—Roland Plottel

[57] ABSTRACT

The present invention relates to amplifier chains such as are found, for example, in carrier analog transmission by cable with repeaters. Intermodulation noise is reduced by opposing an intermodulation noise generated by a compensation source from the signal available at the chain output to the intermodulation noise generated by the chain. It applies in particular to cable transmission links with repeaters to improve the signal-to-noise ratio thereof.

7 Claims, 3 Drawing Figures

METHOD OF COMPENSATION OF INTERMODULATION NOISE AND DEVICES FOR THE IMPLEMENTING THEREOF

The present invention relates to chains of electronic amplifiers such as a cable system for analog carrier transmission using repeaters.

Intermodulation noise is interference generated by an amplifier from components of the signal applied to its input. It is due to imperfect linearity. While negligible in a well-designed amplifier, it can build up in a chain of amplifiers.

The present invention aims to reduce the intermodulation noise generated in a chain of amplifiers in order to improve the signal-to-noise ratio thereof and consequently to improve the quality of the signal transmitted.

It provides a method of reducing the intermodulation noise generated by a chain of amplifiers, the method consisting in submitting the signal available at the output of said chain to the action of a corrector network which partially compensates the phase distortion and the phase jumps due to the chain of amplifiers, before applying the said partially compensated signal to a compensation source which generates intermodulation noise and opposes the said source-generated noise to the said partially compensated signal.

It also provides devices for implementing the preceding method.

Figure 2:
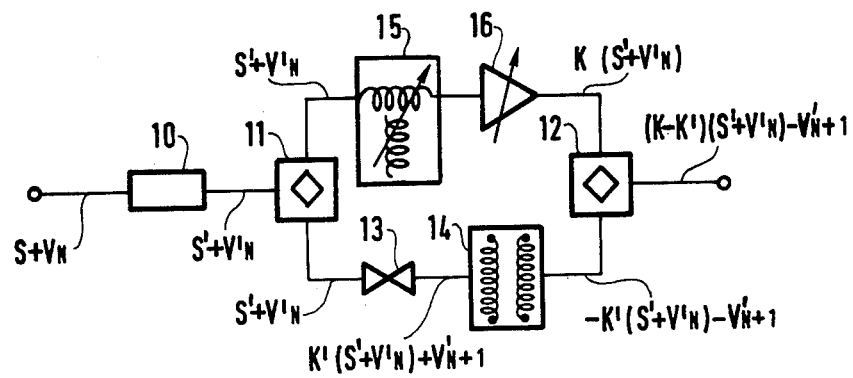
Figure 3:
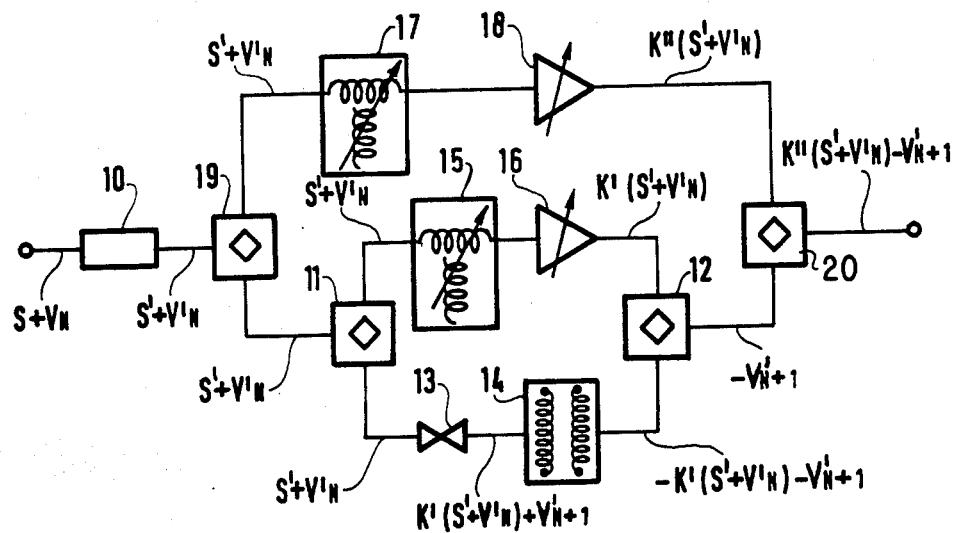

Other characteristics and advantages of the invention will become apparent from the accompanying claims and from the description hereinbelow of several embodiments of the invention given by way of example. This description will be given with reference to the accompanying drawing in which:

FIG. 1 shows an equivalent diagram of a chain of amplifiers terminated by a corrector network and a compensation source; and FIGS. 2 and 3 show block diagrams of circuits embodying the invention.

The intermodulation noise generated by a chain of amplifiers is correlated with the input signal applied to the chain and it is possible to take advantage of this correlation to compensate the intermodulation noise partially. To demonstrate this property, it is necessary to study firstly the characteristics of the components of the intermodulation noise spectrum generated by a chain of amplifiers ended by a corrector network, then the characteristics of the components of the intermodulation noise spectrum generated by a source called the compensation source placed following the corrector network and then to deduce from a comparison of the two spectra conditions which allow some compensation to be effected.

For this study, reference will be made to an analog transmission link by cable with repeaters since this link is one of the types of chains of amplifiers in which the reduction of the intermodulation noise is the most interesting. In such a link, the repeaters used are identical and disposed between sections of cable of same lengths, their gains being adjusted for the transmission signal to be at a same level at the end of each section of cable. Due to these characteristics, such a link can be assimilated, in a first approximation and from the point of view of the intermodulation noise to a chain of N identical points of non-linearity $A_1........A_N$, each having the non-linearity characteristics of a repeater, separated from one another by linear networks with localized and distributed constants $B_1........B_{N-1}$, identical to one another, introducing neither attenuation nor gain and each having a phase law $\beta(\omega)$ equivalent to that of a section of cable associated with a repeater.

FIG. 1 shows such a chain of N identical non-linear elements $A_1....A_N$ separated by linear networks $B_1...B_{N-1}$ with unit gain and a phase law $\beta(\omega)$ said chain being ended by a corrector network C having a transfer coefficient of the form $\alpha' + j\beta'$ followed by a compensation source constituted by an N+1th point of non-linearity $A_{N+1}$ with a characteristic identical to that of the N points of non-linearity $A_1...A_N$ of the chain.

The overall intermodulation noise generated by such a chain and available at the output of the non-linear element $A_N$ is equal to the sum of the intermodulation noise generated by the various points of non-linearity $A_1...A_N$ such as they reach the output of said chain.

To calculate the intermodulation noise generated by a point of non-linearity $A_i$ of the chain, it is assumed that the amplitude of the intermodulation noise generated by the lower order points of non-linearity $A_j$ ($j < i$) of the chain are sufficiently weak in relation to the input signal for it to be possible to neglect their contribution. In this hypothesis, the intermodulation noise due to the point of non-linearity $A_i$ of the chain is generated by this point only from the components of the signal x applied to the input of the chain.

It is assumed that the input signal x can be decomposed into n sinusoidal components whose amplitudes are $U_1 ... U_n$, at angular frequencies $\omega_1 ...\omega_n$ and phases at the origin of $\phi_{o1}...\phi_{on}$:

$$x = \sum_{h\in 1}^{n} U_h \cos(\omega_h t + \phi_{oh})$$

To reach the point of non-linearity $A_i$, the input signal x has had to pass through the networks $B_1 ... B_{i-1}$ and therefore has assumed the value $x_i$ where $$x_i = \sum_{h\in 1}^{n} U_h \cos[\omega_h t + \phi_{oh} + \sum_{j\in 1}^{i-1} \beta(\omega_h)]$$

now:

$$\sum_{j\in 1}^{i-1} \beta(\omega_h) = (i-1)\beta(\omega_h)$$

to simplify, put $$\delta_{ih} = \omega_h t + \phi_{oh} + (i-1)\beta(\omega_h) \qquad (1)$$

and we obtain for the value of $x_i$ $$x_i = \sum_{h\in 1}^{n} U_h \cos\delta_{ih}$$

Because of its nature the point of non-linearity $A_i$ transforms all signals x into a signal y having the form:

$$y = \sum_{l} \lambda_l x^l \text{ with } \lambda_l \text{ constant}$$

so that the signal $x_i$ is transformed into a signal $y_i$ having the form:

$$y_i = \Sigma \lambda_l \left[ \sum_{h\in 1}^{n} U_h \cos\delta_{ih} \right]^l$$

On developing this expression and on transferring the products of the cosines into a sum by the usual trigonometrical relationships, we obtain an equation P of the form:

$$y_i = \sum_{p\in P} k_p [\prod_{r\in 1}^{n} U_r^{|\epsilon_{pr}|}] \cdot \cos \sum_{r\in 1}^{n} \epsilon_{pr}\delta_{ir} \quad (2)$$

where $k_p$ is a constant and P is the assembly of the linear forms p defined by the positive or negative whole number values $(\epsilon_{p1}, \epsilon_{p2}, ... \epsilon_{pn})$ of the n components of the input signal x.

We take, to simplify the writing:

$$p(a) = \sum_{r\in 1}^{n} \epsilon_{pr}a_r \quad (3)$$

$$U_{op} = k_p \prod_{r\in 1}^{n} U_r^{|\epsilon_{pr}|} \quad (4)$$

Relation (2) becomes:

$$y_i = \sum_{p\in P} U_{op} \cos[p(\delta_i)]$$

replacing $\delta_i$ by its value taken in equation (1), the preceding expression becomes:

$$y_i = \sum_{p\in P} U_{op}\cos[p(\omega)t + p(\Phi_o) + (i-1)p(\beta(\omega))]$$

This expression shows that the signal at the output of a point of non-linearity can be considered as the sum of a number of components whose frequency is $p(\omega)t$. Those whose linear form p comprises only one non-zero coefficient $\delta_{pr}$ equal to unity, correspond to the fundamental components of the useful signal. The others, which will be referenced $Y'_i$ and whose linear forms p belong to a sub-set P' having either a coefficient with an absolute greater than unity, or more than one non-zero coefficient $\delta_{pi}$, correspond to the harmonics and to the intermodulation products and form interference noise:

$$y_i = \sum_{p\in P'} U_{op}\cos[p(\omega)t + p(\Phi_o) + (i-1)p(\beta(\omega))]$$

To reach the output of the chain the components of the noise $y'_i$ generated by the point of non-linearity $A_i$ must pass through the networks $B_i ... B_{N-1}$. They keep their amplitudes and undergo a phase shift equal to:

$$[(N-1) - (i-1)]\beta(p(\omega)) = (N = i)\beta(p(\omega))$$

Consequently, the noise due to the point of non-linearity $A_i$ has the following value at the output of the chain:

$$V_i = \sum_{p\in P'} U_{op}\cos[p(\omega)t + p(\Phi_o) + (i-1)p(\beta(\omega)) + (N-1)\beta(p(\omega))]$$

To simplify the previous expression, we take:

$$\theta_p = p(\beta(\omega)) - \beta(p(\omega)) \quad (5)$$

$$\psi_p = p(\Phi_o) + (N-1)\beta(p(\omega)) \quad (6)$$

there results:

$$V_i = \sum_{p\in P'} U_{op}\cos[p(\omega)t + \psi_p + (i-1)\theta_p]$$

Put the sum at the outputs of the chain of noise generated by the N points of non-linearity $A_i .... A_n$ as $V_n$ and we have:

$$V_N = \sum_{i\in 1}^{n} V_i = \sum_{p\in P'} U_{op}[\sum_{i\in 1}^{N} \cos(p(\omega)t + \psi_p + (i-1)\theta_p)]$$

Now:

$$\sum_{i\in 1}^{N} \cos[p(\omega)t + \psi_p + (i-1)\theta_p] =$$

$$\frac{\sin\frac{1}{2}(N\theta_p)}{\sin\frac{1}{2}(\theta_p)} \cos[p(\omega)t + \psi_p + (N-1)\frac{1}{2}\theta_p]$$

Whence:

$$V_N = \sum_{p\in P'} U_{op} \frac{\sin\frac{1}{2}(N\theta_p)}{\sin\frac{1}{2}(\theta_p)} \cos[p(\omega)t + \psi_p + (\frac{N-1}{2})\theta_p]$$

It is observed according to the preceding equation that the components of the non-linearity noise of the chain corresponding to the noise at the output of the first amplifier of the chain has been made to undergo a phase shift equal to: $(N-1/2)\theta_p$ and an amplification equal to:

$$\frac{\sin\frac{1}{2}(N\theta_p)}{\sin\frac{1}{2}(\theta_p)}$$

At the output of the corrector network C whose transfer coefficient is $\alpha' + j\beta'$, the noise $V'_N$ of the chain non-linearity takes the value $V'_N$: where $$V'_N = \sum_{p\in P'} U_{op} \frac{\sin\frac{1}{2}(N\theta_p)}{\sin\frac{1}{2}(\theta_p)} e^{\alpha'(p(\omega))}\cos[p(\omega)t + \psi_p + (\frac{N-1}{2})\theta_p + \beta'(p(\omega))] \quad (7)$$

The non-linearity noise $V'_{N+1}$ due to the non-linear element $A_{N+1}$ is calculated in a similar manner to the non-linearity noise $V'_i$ due to a non-linear element $A_i$ taking into account the corrector network C:

$$V_{N+1} = \sum_{p\in P'} k_p[\prod_{r\in 1}^{n} U_r'^{|\epsilon_{pr}|}]\cos(\sum_{r\in 1}^{n} \epsilon_{pr}\delta'_{ir})$$

where:

$$U_r' = U_r \cdot e^{\alpha'(\omega r)}$$

this giving rise to:

$$k_p \prod_{r \in 1}^{n} U_r |\epsilon_{pr}| = U_{op} \cdot e^{\sum_{r \in 1}^{n} |\epsilon_{pr}| a'(\omega_r)}$$

and $$\delta_{ir}' = \omega_r t + \phi_{or} + (N-1)\beta(\omega_r) + \beta'(\omega_r)$$

On developping $\delta'$ in equation (8) and on introducing the notation p defined in equation (3), we obtain:

$$V_{N+1} = \sum_{p \in P} U_{op} \cdot e^{\sum_{r \in 1}^{n} |\epsilon_{pr}| a'(\omega_r)}$$
$$\cdot \cos[p(\omega)t + p(\phi_o) + (N-1)p(\beta(\omega)) + p(\beta'(\omega))]$$

or even, on introducing the angles $\theta_p$ and $\Psi_p$ $$V_{N+1} = \sum_{p \in P} U_{op} \cdot e^{\sum_{r \in 1}^{n} |\epsilon_{pr}| a'(\omega_r)} \tag{9}$$
$$\cdot \cos[p(\omega)t + \psi_p + (N-1)\theta_p + p(\beta'(\omega))]$$

To examine the possibilities of compensating the non-linearity noise, $V'_N$ generated by the chain of amplifiers, by means of the non-linearity noise $V'_{N+1}$ generated by the N+1th point of non-linearity $A_{N+1}$, we express the phase differences $\Gamma_p$ and the amplitude differences $\Delta V_p$ of the components of the noises $V'_N$ and $V'_{N+1}$ relative to the linear form p, on the basis of equations (7) and (9).

$$\Delta V_p = U_{op} \left[ \left| \frac{\sin \frac{1}{2}(N\theta_p)}{\sin \frac{1}{2}(\theta_p)} \right| e^{a'p(\omega)} - e^{\sum_{r \in 1}^{n} |\epsilon_{pr}| a'(\omega_r)} \right] \tag{10}$$

$$\Gamma_p = \beta'(p(\omega)) - p(\beta'(\omega)) - \left(\frac{N-1}{2}\right)\theta_p + K\pi \tag{11}$$

K being an even whole number when the expression $$\frac{\sin \frac{1}{2}(N\theta_p)}{\sin \frac{1}{2}(\theta_p)}$$

is positive and being odd in the contrary case.

Certain linear forms for which $\theta_p$ is weak, in particular those for which $p(1)-1 = 0$, lead to particularly inconvenient intermodulation noise (products of intermodulation of type A + B − C for example), it will be observed that in this case the factor $$\frac{\sin \frac{1}{2}(N\theta_p)}{\sin \frac{1}{2}(\theta_p)}$$

becomes negative only for a number of points of non linearity N which is very great.

On replacing $\theta_p$ by its value taken in equation (5) and on using the properties of the linear forms, equation (11) becomes:

$$\Gamma_p = \beta'(p(\omega)) + \left(\frac{N-1}{2}\right)\beta(p(\omega)) - p(\beta'(\omega)) + \left(\frac{N-1}{2}\right)\beta(\omega)) + K\pi \tag{12}$$

It will be observed that if the function $$g(\omega) = \beta'(\omega) + \left(\frac{N-1}{2}\right)\beta(\omega)$$

reduces to angular frequency $\omega$, to the nearest multiplicative factor d, the phase deviation $\Gamma_p$ is zero or equal to $\Gamma$ for all the linear forms p. Indeed:

$$\Gamma_p = g(p(\omega)) - p(g(\omega)) + K\pi = dp(\omega) - p(d.\omega) + K\pi = K\pi$$

Consequently a sufficient condition for the components of the noise $V'_n$ and $V_{n+1}$ to be in phase or in opposition is that we have the equation:

$$\beta'(\omega) + \left(\frac{N-1}{2}\right)\beta(\omega) = d \cdot \omega + 2K_1\pi \tag{13}$$

d being a constant and $K_1$ being an integer.

To make clear the consequences of this condition on the relationships between the phase laws $\beta$ and $\beta'$, these latter are put in the following conventional form:

$$\beta = a + b\omega + f(\omega)$$

and a and b are constants, and $f(\omega)$ is a function representing the deviation from linearity.

$$\beta' = a' + b'\omega + f'(\omega)$$

where a' and b' are constants, and $f'(\omega)$ is a function representing the deviation from linearity.

The quantities a and a' will be called "phase jumps" in the following part of the text:
Equation (13) becomes:

$$d\omega = \left(a' + \left(\frac{N-1}{2}\right)a\right) + \left(b' + \left(\frac{N-1}{2}\right)b\right)\omega + f'(\omega) + \left(\frac{N-1}{2}\right)f(\omega) + 2K_1\pi$$

Equating term by term, we arrive at a system of equations as follows:

$$a' + \left(\frac{N-1}{2}\right)a = 2K_2\pi \tag{14}$$

$K_2$ being an integer $$f'(\omega) + \left(\frac{N-1}{2}\right)f(\omega) = 2K_3\pi \tag{15}$$

$K_3$ being an integer

Equation (14) gives a condition linking the phase jumps of the laws $\beta$ and $\beta'$. On observing that the phase law $(N-1)\beta(\omega)$ is that of the chain of amplifiers, equation (14) can be expressed by saying that the phase law $\beta'(\omega)$ must make up, to the nearest $2K\pi$, half the phase jumps due to the chain of amplifiers.

Equation (15) gives a condition linking the linearity deviations of the laws $\beta$ and $\beta'$. It can be expressed by saying that the phase law $\beta'(\omega)$ must make up, to the nearest $2K\pi$, half the phase distortion introduced by the system.

It will be observed also that equation (14) giving a condition on the phase jumps, is superfluous for the intermodulation products corresponding to linear forms satisfying the equation p(1) − 1 = 0 for example intermodulation products of the type A+B−C. Indeed, the phase jumps occur with a coefficient p(1) − 1 in the equation (11) giving the phase deviation p.

Examining equation (10) which gives the differences of amplitudes $\Delta V_p$ of the components of the non-linearity noise $V'_N$ and $V'_{N+1}$, does not allow a gain of $a'$ of simple form capable of cancelling said difference for all the linear forms p.

If a gain equal to 1 is imparted to the corrector network C, equation 10 becomes:

$$\Delta V_p = U_{op}\left(\left|\frac{\sin\frac{1}{2}(N\theta_p)}{\sin\frac{1}{2}(\theta_p)}\right| - 1\right)$$

It is then possibe to try to reduce the differences of amplitudes $\Delta V_p$ by completing the N+1 th point of non-linearity by a chain of non-linearity $A_{N+2}, \ldots A_{N+N'}$, having the same characteristics as the points of of non-linearity $A_1 \ldots A_N$ separated by the networks $B_{N+2} \ldots B_{N+N'-1}$ causing neither gain nor attenuation and having the phase law $\beta(\omega)$. This is in fact equivalent to choosing as a compensation source a circuit having characteristics which, from the point of view of non-linearity and of the phase, are analogous to those of a part of the chain of amplifiers.

By a calculation of the same type as the previous one, the following expression is obtained for the non-linearity noise $V_{n+n'}$ of this new source of compensation:

$$V_{N+N'} = \sum_{P \in P'} U_{op} \frac{\sin\frac{1}{2}(N'\theta_p)}{\sin\frac{1}{2}(\theta_p)} \cos[p(\omega)t + \psi_p + (N-1)\theta_p + p(\beta'(\omega)) + (\frac{N'-1}{2})\theta_p]$$

and for the differences of amplitude $\Delta V_p$ and of phase $\Gamma_p$ of the components of the non-linearity noise of the chain of amplifiers and of the new source of compensation:

$$\Delta V_p = U_{op}\frac{\sin\frac{1}{2}(N\theta_p) - \sin\frac{1}{2}(N'\theta_p)}{\sin\frac{1}{2}(\theta_p)} \quad (16)$$

$$\Gamma_p = \beta'(p(\omega)) - p(\beta'(\omega)) - (\frac{N+N'-2}{2})\theta_p + K''\pi$$

K' being an even whole number if the expressions have the same sign and being odd in the contrary case.

The conditions on the phase laws $\beta$ and $\beta'$ for obtaining a phase deviation $\Gamma_p$ of zero or equal to $\pi$ whatever the linear form p may be, become:

$$a' + (\frac{N+N'-2}{2})a = 2K_2\pi$$

$$f(\omega) + (\frac{N+N'-2}{2})f(\omega) = 2K_3\pi$$

It will be observed according to equation (16) that the amplitude deviations $\Delta V'_p$ are cancelled when N' is equal to N.

In conclusion, the preceding calculations show that the non-linearity noise components and consequently the intermodulation noise components generated by a chain of amplifiers can be put in phase or in phase opposition with the components of the non-linearity noise generated by a compensation source from the output signal of the chain of amplifiers by interposing an adequate phase corrector network between the output of the chain of amplifiers and the input of the compensation source. By compensating a precise proportion of the phase non-linearity distortion due to the chain to the nearest $2K\pi$, this proportion depending on the characteristics of the compensation source, the corrector network will allow the putting into phase or into phase opposition of the components of the relative intermodulation noise with linear forms p satisfying the condition:

$$p(1) - 1 = 0$$

Further by compensating the phase jumps due to the chain to the nearest $2K\pi$ in the same proportion, the corrector network will allow the putting into phase or into phase opposition of all the components of the intermodulation noise.

This possibility of putting the components of the intermodulation noise of a chain of amplifiers into phase with or into phase opposition with the components of the intermodulation noise of another source can be used to obtain a reduction of the intermodulation noise of the signal coming from said chain of amplifiers, since it will only be necessary to oppose the intermodulation noise of said source to said signal in proportions such as to cancel the components of the intermodulation noise which interfere most with said signal.

FIG. 2 shows a block diagram of an electric circuit implementing this noise reduction method. This circuit comprises a phase correcting network 10 at its input followed by a compensating circuit with two parallel branches separated at their inputs by a directive coupler 11 and connected at their outputs by a directive coupler 12. One of the branches comprises, disposed in series and following each other, a compensation source 13 followed by an inverting transformer 14. The other branch comprises an adjustable phase shifter 15 in series with an adjustable gain circuit 16.

The phase corrector circuit 10 receives from the chain of amplifiers the signal S with intermodulation noise $V_N$. It modifies the phases of the signal S and of the intermodulation noise $V_N$ so that at its output, the components $V'_N$ of the noise are in phase or in phase opposition with the components of the noise $V'_{N+1}$ generated by the compensation source 13.

The compensating circuit introduces a difference in operation of $(2K+1)\pi$ between the signal $(S'+V'_n)$ coming from the phase corrector circuit 10 and the output signal of the compensation source 13 before summing them. The directive coupler 11, placed at its input, splits the signal $(S'+V'_N)$ over the two parallel branches. In one of its branches, the signal $S'+V'_N$ is subjected to the compensation source 13 which transforms it into a signal $K'(S'+V'_N) + V'_{N+1}$, then to the inverting transformer 14 where it becomes: $-K'(S'+V'_N) - V'_{N+1}$. In the other branch, the signal $(S'+V'_N)$ is subjected to the adjustable phase shifter 15 making it possible to take into account the phase shift brought about in the signal on the other branch by the compensation source 13 and an adjustable gain circuit 16 allowing its level to be adjusted. It becomes K(S'+V'$_N$). The directive coupler 12 allows the signals which reach it from the two parallel branches to be summed so that the signal obtained at the output is equal to:

$$(K-K')(S'+V'_N) - V'_{N+1}.$$

The factor K is adjusted so as to obtain the best possible signal-to-noise ratio at the output.

The constitution of the source of compensation depends on the chain of amplifiers. It is advantageously chosen so that the compensation source will have the same non-linearity and phase characteristics as a more or less large part of the chain. The phase corrector network is entirely determined by the usual techniques from the required phase law. This law is established as has been seen previously from the phase jump and from the linearity deviation of the phase law of the chain of amplifiers.

FIG. 3 shows another circuit for the reduction of intermodulation noise which differs from the previous one by a more complex compensating circuit allowing the intermodulation noise components to be isolated from the compensation source. It comprises a phase corrector network 10 at its input followed by a compensating network with two main branches one of which is divided into secondary branches. One of the main branches resumes the structure of the compensating circuit of FIG. 2 while the other main branch comprises an adjustable phase shifter 17 and an adjustable gain circuit 18.

The directive coupler 19 placed at the input of the balancing circuit directs the signal (S'+V'$_N$) towards the two main branches. In the main branch divided into two secondary branches, this signal is used to set up an intermodulation noise V'$_{N+1}$ in the compensation source 13 and to isolate it. In the other main branch the signal (S'+V'$_N$) undergoes a phase adjustment and an amplitude adjustment before being summed with the intermodulation noise V'$_{N+1}$.

In relation to the preceding circuit, this circuit is easier to adjust since it makes it possible to isolate the intermodulation noise due to the compensation source.

The methods and the circuits which have just been described apply advantageously to the reduction of the intermodulation noise component of order 3 of the type A+B−C in analog carrier transmission systems by cables with repeaters.

What is claimed is:

1. A method of reducing the intermodulation noise in an analog transmission system of the type that includes a plurality of cascaded repeaters, which comprises the steps of:
   (a) applying the output signal from said transmission system to a phase-correcting network to at least partially compensate for the phase-distortion and phase-discontinuities caused by said cascaded repeaters;
   (b) applying the output of said phase-correcting network to the input of a source of a compensating, intermodulation noise signal; and
   (c) combining the output signal from said compensating source with a gain-modified version of the output signal from said phase-correcting network in such a way that the intermodulation noise components of significance are cancelled.

2. The method according to claim 1 wherein said phase-correcting network compensates for one half of the phase-distortion introduced by said cascaded repeaters.

3. The method according to claim 1 wherein said phase-correcting network compensates, to the nearest 2K$\pi$, K = 0, 1, 2...., half of the phase-discontinuities introduced by said cascaded repeaters.

4. The method according to claim 1 wherein said source of a compensating noise signal has a non-linearity characteristic substantially identical to that of one of said cascaded repeaters.

5. The method according to claim 1 wherein said source of a compensating noise signal has an electrical characteristic substantially identical to that of a section of said transmission system.

6. Apparatus for reducing the intermodulation noise in an analog transmission system of the type that includes a plurality of cascaded repeaters, which comprises:
   a) a phase-correcting network having an input connected to the output of said analog transmission system;
   b) a first directional coupler having an input connected to the output of said phase-correcting network and first and second outputs;
   c) a source of a compensating intermodulation noise signal having an input connected to the first output of said first directional coupler;
   d) a phase-inverting transformer having its primary winding connected to the output of said compensating noise signal source;
   e) a first adjustable phase-shift network having an input connected to the second output of said first directional coupler;
   f) a first variable-gain amplifier having an input connected to the output of said first phase-shift network; and
   g) a second directional coupler having a first input connected to the output of said first variable-gain amplifier and a second input connected to the secondary of said phase-inverting transformer, the output of said second directional coupler comprising the output of said transmission system with reduced noise.

7. The apparatus according to claim 6 further comprising:
   a third directional coupler having an input connected to the output of said phase-correcting network and first and second outputs, said first output being connected to the input of said first directional coupler;
   a second, adjustable phase-shift network having an input connected to the second output of said third directional coupler;
   a second, variable-gain amplifier having an input connected to the output of said second phase-shift network; and
   a fourth, directional coupler having a first input connected to the output of said second directional coupler and a second input connected to the output of said second variable-gain amplifier, the output of said fourth directional coupler comprising the output of said transmission system with reduced noise.

* * * * *

UNITED STATES PATENT OFFICE
CERTIFICATE OF CORRECTION

Patent No. 4,131,859　　　　　　　　　　Dated　Dec. 26, 1978

Inventor(s)　Pierre Della Valle

It is certified that error appears in the above-identified patent and that said Letters Patent are hereby corrected as shown below:

On the title page, correct the inventor's name from

"Pierre D. Valle" to --Pierre Della Valle--.

Signed and Sealed this

*Third* Day of *April 1979*

[SEAL]

*Attest:*

RUTH C. MASON
*Attesting Officer*

DONALD W. BANNER
*Commissioner of Patents and Trademarks*